(12) United States Patent
Teshima et al.

(10) Patent No.: US 6,444,925 B1
(45) Date of Patent: Sep. 3, 2002

(54) PRESS-FIT PIN CONNECTION CHECKING METHOD AND SYSTEM

(75) Inventors: Yasuhiro Teshima; Hideaki Matsumoto; Kazunari Fukagawa, all of Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/871,377

(22) Filed: May 31, 2001

(30) Foreign Application Priority Data

Feb. 8, 2001 (JP) .................................... 2001-031837

(51) Int. Cl.[7] ................................................ H01R 9/09
(52) U.S. Cl. ...................... 174/262; 174/261; 174/265; 174/255; 361/777; 361/774
(58) Field of Search ............................... 174/262, 260, 174/204, 265, 266; 361/801, 803, 807, 809, 810, 784, 785, 791, 777, 778; 439/65, 79

(56) References Cited

U.S. PATENT DOCUMENTS

| | | | |
|---|---|---|---|
| 4,480,885 A | * 11/1984 | Coppelman | 339/45 |
| 4,703,394 A | * 10/1987 | Petit et al. | 361/413 |
| 4,963,098 A | * 10/1990 | Myer et al. | 439/76 |
| 5,243,144 A | * 9/1993 | Ogino et al. | 174/266 |
| 5,499,447 A | * 3/1996 | Murakami | 174/260 |
| 5,575,686 A | * 11/1996 | Noschese | 439/620 |
| 5,578,796 A | * 11/1996 | Bhatt et al. | 174/260 |
| 5,644,475 A | * 7/1997 | Woychik et al. | |
| 5,949,657 A | * 9/1999 | Karabatsos | 361/803 |
| 6,081,430 A | * 6/2000 | La Rue | 361/788 |
| 6,223,973 B1 | * 5/2001 | Wong et al. | 228/180.1 |
| 6,287,129 B1 | * 9/2001 | Kuo | 439/79 |
| 6,312,269 B1 | * 11/2001 | Obata | 174/261 |
| 6,329,604 B1 | * 12/2001 | Koya | 174/255 |

* cited by examiner

Primary Examiner—Kamand Cuneo
Assistant Examiner—Tuan Dinh
(74) Attorney, Agent, or Firm—Katten Muchin Zavis Rosenman

(57) ABSTRACT

A press-fit pin connection checking method using a first printed circuit board having a plurality of through holes in which a plurality of press-fit pins of a first press-fit connector are adapted to be respectively press-fitted, and a checking conductor pattern formed so as to be electrically insulated from all of the through holes and to, surround all of the through holes for engagement with the first press-fit connector. The press-fit pin connection checking method includes the steps of mounting the first press-fit connector on the first printed circuit board, providing a checking jig having a second printed circuit board and a second press-fit connector mounted on the second printed circuit board, engaging the second press-fit connector of the checking jig with the first press-fit connector, and selectively connecting the checking conductor pattern of the first printed circuit board to output lands of the checking jig.

10 Claims, 13 Drawing Sheets

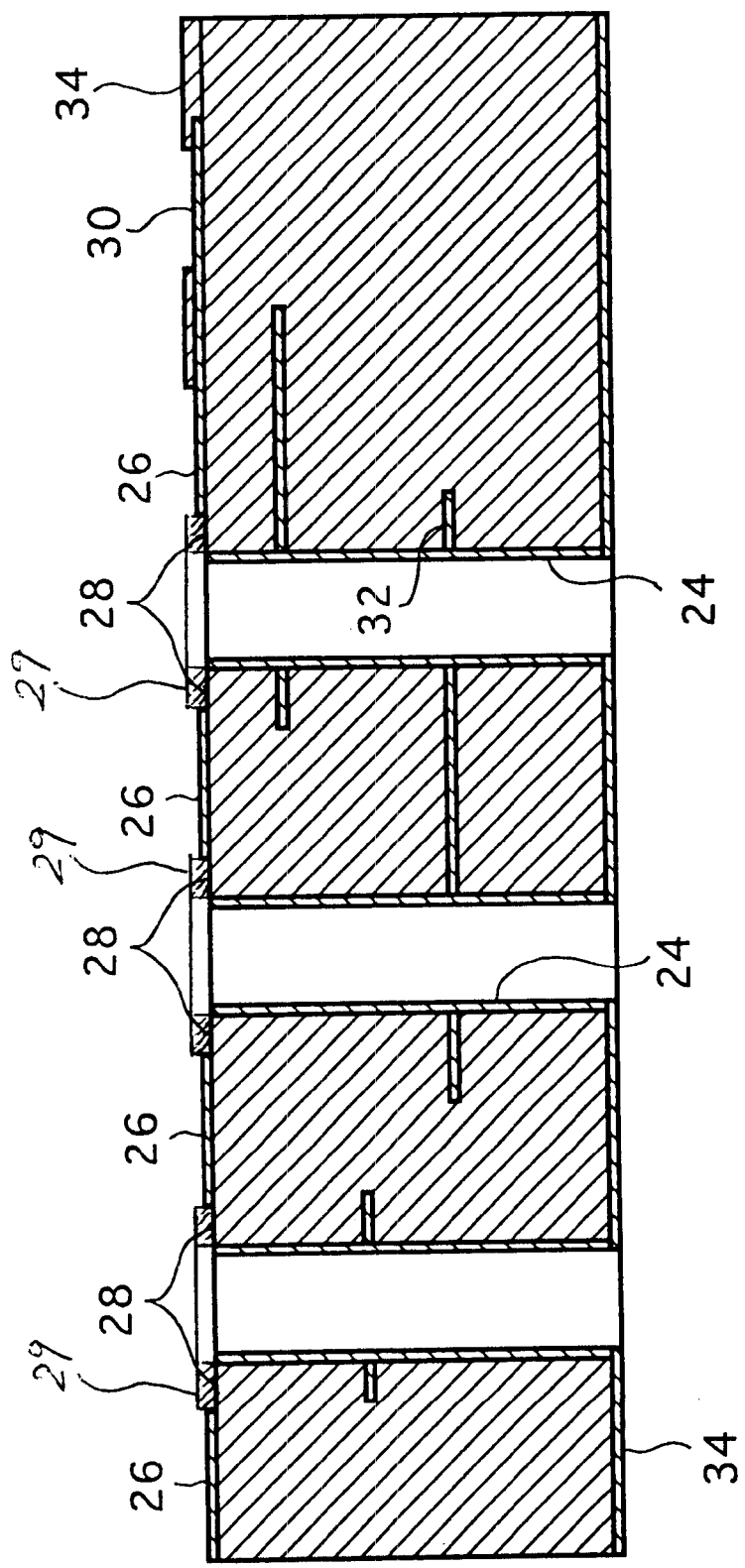

PRESS-FIT PIN CONNECTION CHECKING METHOD AND SYSTEM

BACKGROUND OF THE INVENTION

1. Field of the Invention

The present invention relates to a press-fit pin connection checking method and system.

2. Description of the Related Art

In recent communications equipment, high-density packaging has proceeded in response to the demands for high performance and multi-functionality to devices to be packaged, so that an increase in number of printed wiring boards layered and a decrease in bonding area and conductor spacing are remarkably proceeding. A component mounting method is also changing from an insert mount technology (IMT) such that a lead is inserted into a through hole and is bonded by flow soldering to a surface mount technology (SMT) such that a component is mounted on a surface pattern and is bonded by reflow soldering, and the SMT is becoming mainstream. At present, the component mounting method is in the shift from the IMT to the SMT, and a printed circuit board (plug-in unit) using both the technologies as mixed is most dominating.

In such a recent trend, a connector component for connecting the printed circuit board to a back wiring board has also changed, and the shift from an insert mount device (IMD) to a surface mount device (SMD) as the connector component has been examined. However, a bonding force for each pin is reduced by adopting the SMT, and the connector component cannot endure a total pressure applied in connecting the printed circuit board and the back wiring board. To cope with this problem, a press-fit connector bonding technique (gastight bonding technique) of press-fitting a press-fit pin into a through hole has risen.

The press-fit connector bonding technique has such merits that the bonding force for each pin is high to ensure a strong holding force of the connector as a whole, that the flow soldering step as a main bonding method in the IMT can be omitted, that the shift to the SMT can be made smoothly, and that the connector is repairable. As seen from the connection between a plug-in unit and a back wiring board, it is considered that the press-fit connector bonding technique will become a dominating technique in the future connector bonding for communications equipment. However, although the IMT is being currently shifted to the SMT, there exist many IMDs that cannot support the SMT, and it is therefore difficult to completely shift the IMT to the SMT in the near future.

In recent communications equipment, not only the high-density packaging has proceeded, but also a signal transmission speed has been increased year by year. Accordingly, increasing a signal transmission speed between a plug-in unit (PIU) and a back wiring board (BWB) is also proceeding. The technique required for high-speed signal transmission includes the suppression of transmission loss, the suppression of reflected waves, and the unification of propagation delay. Accordingly, a connector structure supporting high-speed signal transmission includes a shielding structure, shortening the length of a press-fit pin, and equalizing the lengths of differential signal pair lines. A characteristic impedance is controlled by the shielding structure to suppress the transmission loss. The length of a press-fit pin is shortened to suppress the reflected waves. The lengths of differential signal pair lines are equalized to unify the propagation delay.

While a plug-in unit and a back wiring board are connected by a press-fit connector in general as described above, a plurality of press-fit pins are press-fitted into a plurality of through holes to thereby mount the press-fit connector on the back wiring board or the plug-in unit. Accordingly, it is necessary to check that the press-fit pins are completely press-fitted in the through holes. At present, whether or not the connection of the press-fit pins and the through holes after press-fitting the press-fit pins is acceptable is checked by only visual check for the plug-in unit and by visual check and electrical check in combination for the back wiring board.

FIG. 1 is a schematic sectional view for illustrating a plug-in unit checking method in the prior art. Reference numeral 2 denotes a plug-in unit having a plurality of through holes 4, and reference numeral 6 denotes a press-fit connector having a plurality of press-fit pins 8. The press-fit pins 8 of the press-fit connector 6 are press-fitted into the through holes 4 of the plug-in unit 2 to thereby mount the press-fit connector 6 on the plug-in unit 2. In the conventional visual checking method, whether or not the connection of the press-fit pins 8 and the through holes 4 is acceptable is checked by seeing the through holes 4 from one side (back side) of the plug-in unit 2 opposite to the press-fit connector 6 after press-fitting the press-fit pins 8 into the through holes 4 and by determining whether or not the front ends of the press-fit pins 8 project from the back side of the plug-in unit 2.

Referring to FIG. 2, there is shown a schematic sectional view for illustrating a back wiring board checking method in the prior art. Reference numeral 10 denotes a back wiring board having a plurality of through holes 12, and reference numeral 14 denotes a press-fit connector having a plurality of press-fit pins 16. The press-fit pins 16 of the press-fit connector 14 are press-fitted into the through holes 12 of the back wiring board 10 to thereby mount the press-fit connector 14 on the back wiring board 10. The press-fit connector 6 on the PIU side is preliminarily mounted on a checking printed circuit board 18. The press-fit connector 6 on the PIU side is engaged into the press-fit connector 14 on the BWB side to thereby electrically connect the checking printed circuit board 18 to the back wiring board 10. The checking printed circuit board 18 has a plurality of conductor patterns respectively corresponding to the press-fit pins of the press-fit connector 6 and a plurality of output lands respectively formed at the front ends of the conductor patterns.

In the conventional electrical checking method for the press-fit pins 16 on the BWB side as shown in FIG. 2, two checking printed circuit boards 18 are electrically connected to the back wiring board 10, and the output lands of the two checking printed circuit boards 18 are selectively connected to check the electrical continuity, thereby determining whether or not the press-fitted condition of the press-fit pins 16 is acceptable. The wiring in the back wiring board 10 is complicatedly connected to a plurality of plug-in units 2. Accordingly, to check the connection of all the press-fit pins 16 without omission, a continuity check program is prepared for each design of the back wiring board 10 and the plug-in units 2 in combination, and the continuity check is performed in accordance with this program. The visual check for the back wiring board 10 is similar to that for the plug-in unit 2 as mentioned above with reference to FIG. 1. That is, whether or not the connection of the press-fit pins 16 and the through holes 12 is acceptable is checked by determining whether or not the front ends of the press-fit pins 16 project from the back side of the back wiring board 10.

FIGS. 3A to 3C are sectional views showing an acceptable mode and a defective mode. More specifically, FIG. 3A shows an acceptable mode, and FIGS. 3B and 3C show defective modes. The defective modes shown in FIGS. 3B and 3C can be detected by the visual check. However, the defective mode shown in FIG. 3C cannot be detected by the electrical check, because the press-fit pin 16 is in electrical continuity to the through hole 12.

Although the visual check is low in efficiency and detection power to defective connection, all kinds of buckling of the press-fit pin 16 as shown in FIGS. 3B and 3C can be detected as detectable defective modes by the visual check. on the other hand, although the electrical check is high in efficiency, only the complete buckling of the press-fit pin 16 as shown in FIG. 3B such that:the press-fit pin 16 is not in contact with the through hole 12 can be detected as a detectable defective mode by the electrical check, and another kind of buckling of the press-fit pin 16 as shown in FIG. 3C such that the press-fit pin 16 is in contact with the through hole 12 cannot be detected as a defective mode by the electrical check.

In the conventional press-fit pin connection checking method, only the visual check is performed for the plug-in unit, so that the omission of detection of defectives is prone to occur. Also in the connection check for the press-fit pins on the BWB side, the defective mode shown in FIG. 3C can be detected only by the visual check, so that there is a possibility of omission of detection of defectives. In the case that the omission of detection of defectives occurs, the defectives omitted may be detected in subsequent function check or the like. However, a large number of man-hours are needed to seek real defectives.

Further, the conventional connection checking method requires a dedicated jig (including a checking printed circuit board on the PIU side, testing device, and program) for the electrical check for the back wiring board in each product, so that a cost and time for preparation of the connection check are required. Moreover, the visual check for detection of defectives is important in the conventional connection checking method, so that the length of each press-fit pin must be larger than the thickness of a substrate, so as to ensure the detection power. However, a reduction in length of each press-fit pin of a press-fit connector supporting high-speed signal transmission is now being pursued, and it is becoming general that the length of each press-fit pin is smaller than the thickness of the substrate. In this case, the front end of each press-fit pin does not project from the back surface of the substrate, and the visual check cannot therefore be performed.

SUMMARY OF THE INVENTION

It is therefore an object of the present invention to provide a press-fit pin connection checking method and system which can detect defective press-fit of all the press-fit pins by only electrical check.

It is another object of the present invention to provide a press-fit pin connection checking method and system which can detect defective press-fit of each press-fit pin even in the case that the length of each press-fit pin is smaller than the thickness of the substrate.

It is a further object of the present invention to provide a printed circuit board structure required for realization of such a press-fit pin connection checking method.

In accordance with an aspect of the present invention, there is provided a printed circuit board suitable for mounting of a press-fit connector having a plurality of press-fit pins, comprising a substrate; a plurality of through holes formed through said substrate in which said press-fit pins are adapted to be respectively press-fitted; and a checking conductor pattern formed on an upper surface of said substrate so as to be electrically insulated from all of said through holes and to surround all of said through holes for engagement with said press-fit connector; said checking conductor pattern being exposed without being covered with a resist.

Preferably, the upper surface of said substrate is exposed at a portion having a predetermined width between each of said through holes and said checking conductor pattern. Alternatively, the upper surface of said substrate may be covered with a resist at a portion having a predetermined width between each of said through holes and said checking conductor pattern. Preferably, the printed circuit board further comprises a checking output land electrically connected to said checking conductor pattern.

In accordance with another aspect of the present invention, there is provided a press-fit pin connection checking system comprising a first press-fit connector having a plurality of first press-fit pins; a first printed circuit board having a first substrate, a plurality of first through holes formed through said first substrate in which said first press-fit pins are adapted to be respectively press-fitted, and a first conductor pattern formed on an upper surface of said first substrate so as to be electrically insulated from all of said first through holes and to surround all of said first through holes for engagement with said first press-fit connector; a second press-fit connector having a plurality of second press-fit pins and adapted to engage with said first press-fit connector; a second printed circuit board having a second substrate, a plurality of second through holes formed through said second substrate in which said second press-fit pins are adapted to be respectively press-fitted, a plurality of second conductor patterns formed on said second substrate so as to be respectively connected to said second through holes, and a plurality of output lands respectively connected to said second conductor patterns; and means for selectively connecting said first conductor pattern to said output lands.

In accordance with a further aspect of the present invention, there is provided a press-fit pin connection checking method comprising the steps of providing a first printed circuit board having a plurality of first through holes in which a plurality of first press-fit pins of a first press-fit connector are adapted to be respectively press-fitted, and a first conductor pattern formed so as to be electrically insulated from all of said first through holes and to surround all of said first through holes for engagement with said first press-fit connector; press-fitting said plurality of first press-fit pins of said first press-fit connector into said plurality of first through holes of said first printed circuit board to thereby mount said first press-fit connector on said first printed circuit board; providing a checking jig including a second printed circuit board and a second press-fit connector mounted on said second printed circuit board, said second printed circuit board having a plurality of second through holes, a plurality of second conductor patterns respectively connected to said second through holes, and a plurality of output lands respectively connected to said second conductor patterns, said second press-fit connector having a plurality of second press-fit pins press-fitted in said plurality of second through holes of said second printed circuit board; engaging said second press-fit connector of said checking jig with said first press-fit connector mounted on said first printed circuit board; and selectively connecting said first conductor pattern of said first printed circuit board to said output lands of said second printed circuit board; wherein when there is no electrical continuity between said first conductor pattern and each of said output lands, it is determined that the connection of said first press-fit pins and said first through holes is acceptable, whereas when there is electrical continuity between said first conductor pattern and each of said output lands, it is determined that the connection of said first press-fit pins and said first through holes is defective.

Preferably, said first printed circuit board further has a checking output land electrically connected to said first conductor pattern; and the selective connection of said first conductor pattern and said output lands is provided by connecting a probe pin to said checking output land and selectively bringing said probe pin into contact with said output lands. The detection of no electrical continuity indicates an acceptable mode, and the detection of electrical continuity indicates a defective mode.

The above and other objects, features and advantages of the present invention and the manner of realizing them will become more apparent, and the invention itself will best be understood from a study of the following description and appended claims with reference to the attached drawings showing some preferred embodiments of the invention.

BRIEF DESCRIPTION OF THE DRAWINGS

FIG. 5A is a cross section showing resist 29;

DETAILED DESCRIPTION OF THE PREFERRED EMBODIMENTS

Figure 1:
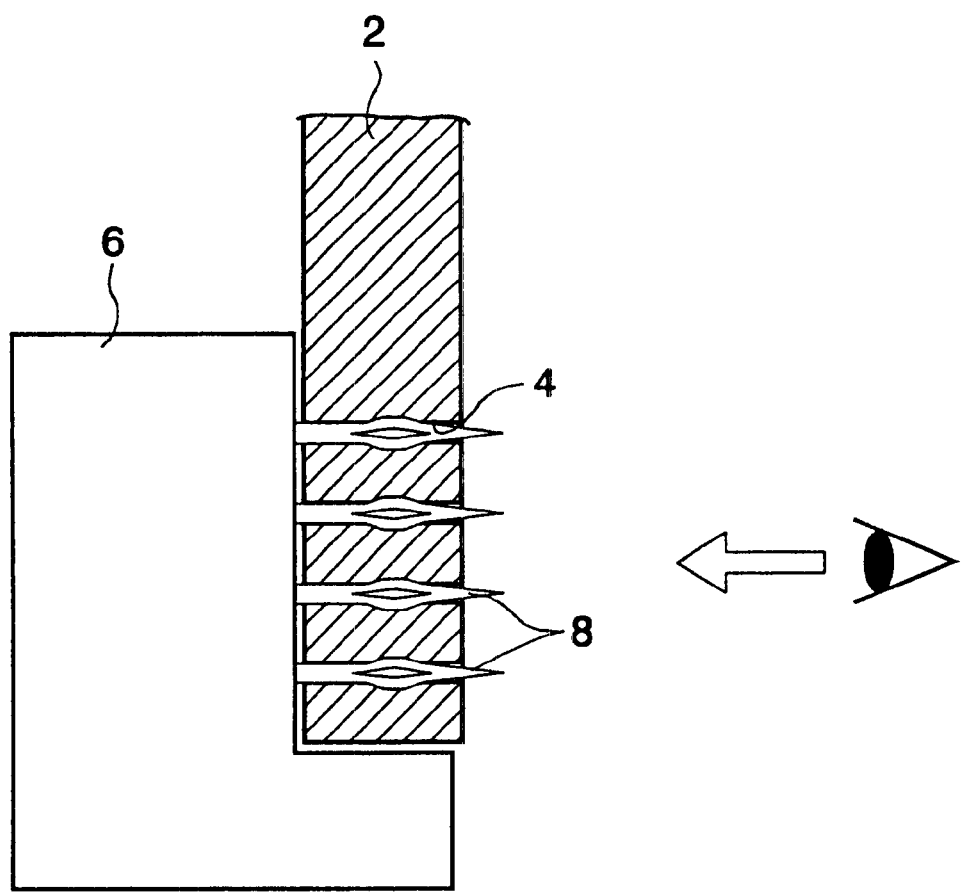
FIG. 1 is a schematic sectional view for illustrating a plug-in unit checking method in the prior art.
Figure 2:
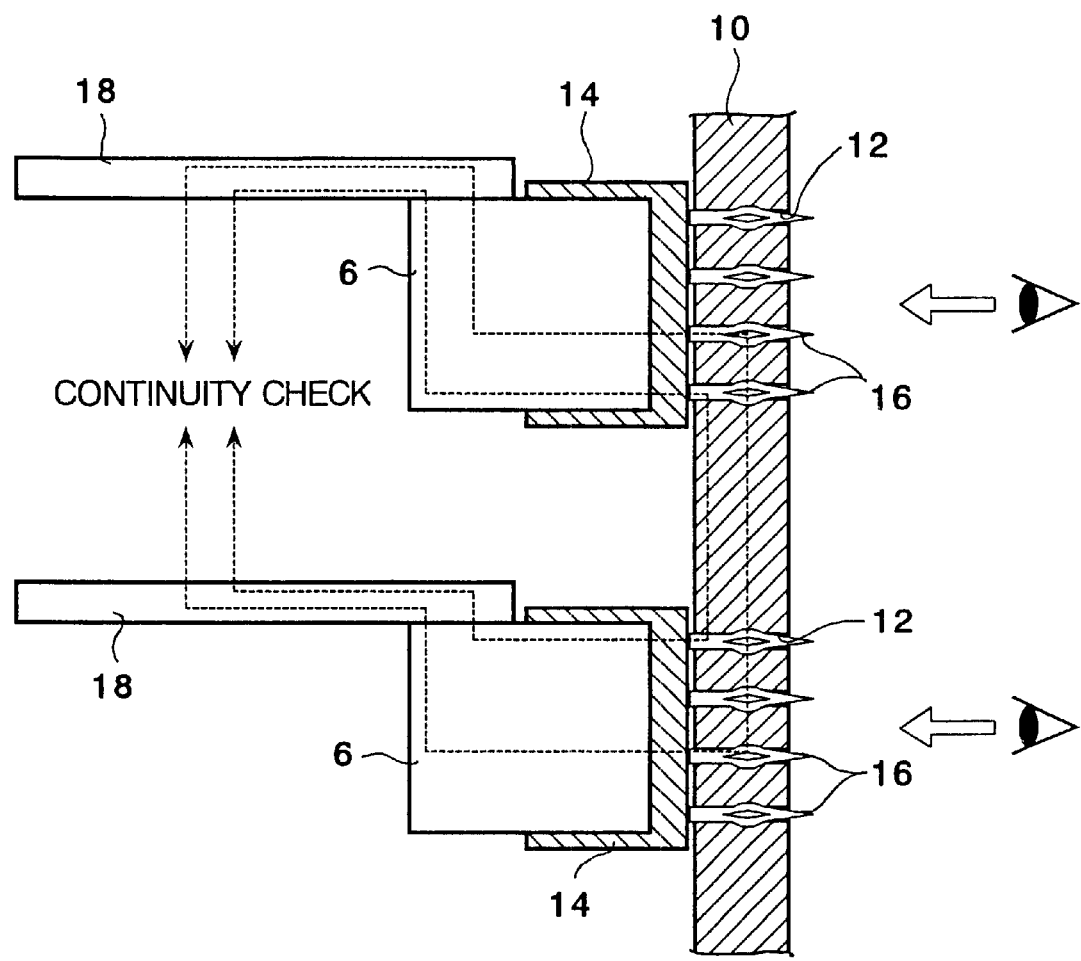
FIG. 2 is a schematic sectional view for illustrating a back wiring board checking method in the prior art.
Figure 3A:
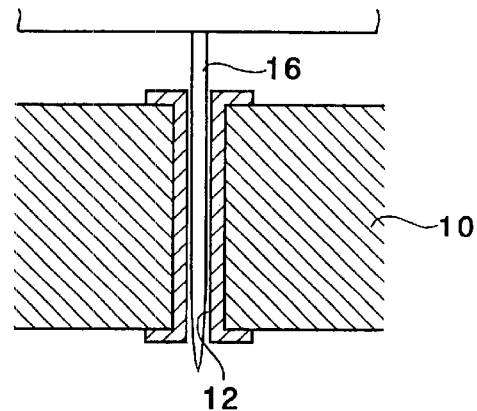
FIG. 3A is a sectional view showing an acceptable mode.
Figure 3B:
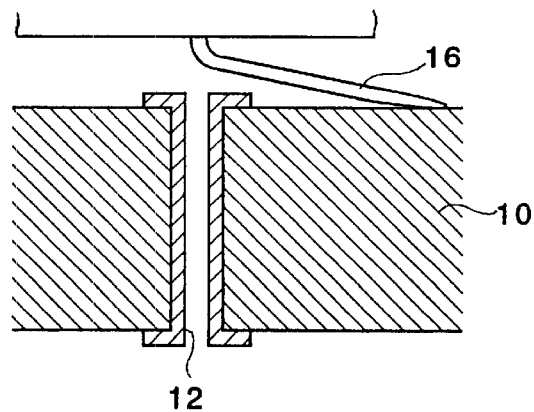
FIGS. 3B and 3C are sectional views showing defective modes.
Figure 3C:
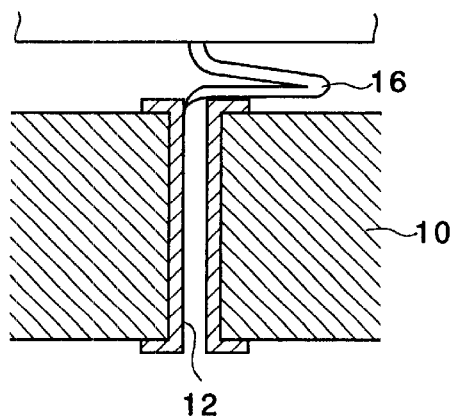
Figure 4:
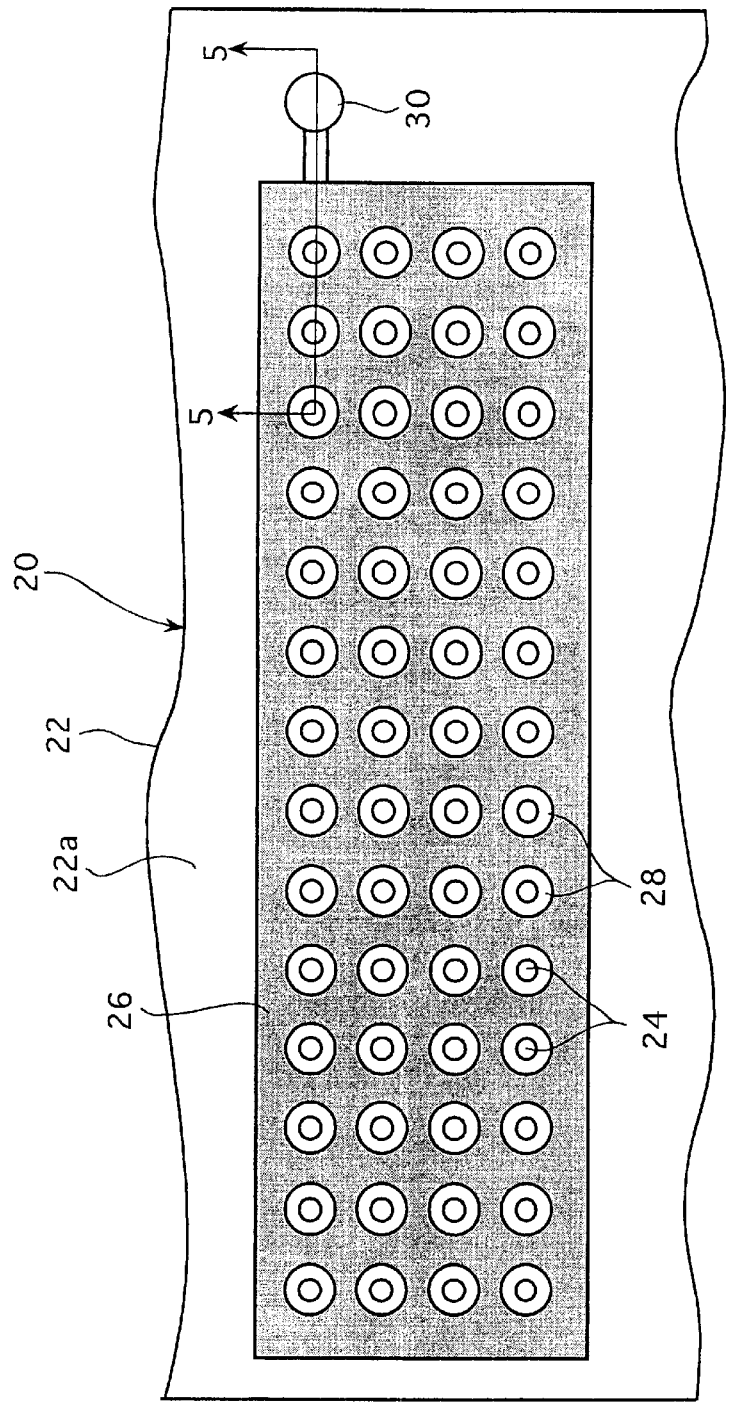
FIG. 4 is a partially cutaway plan view of a printed circuit board according to a preferred embodiment of the present invention.
Figure 5:
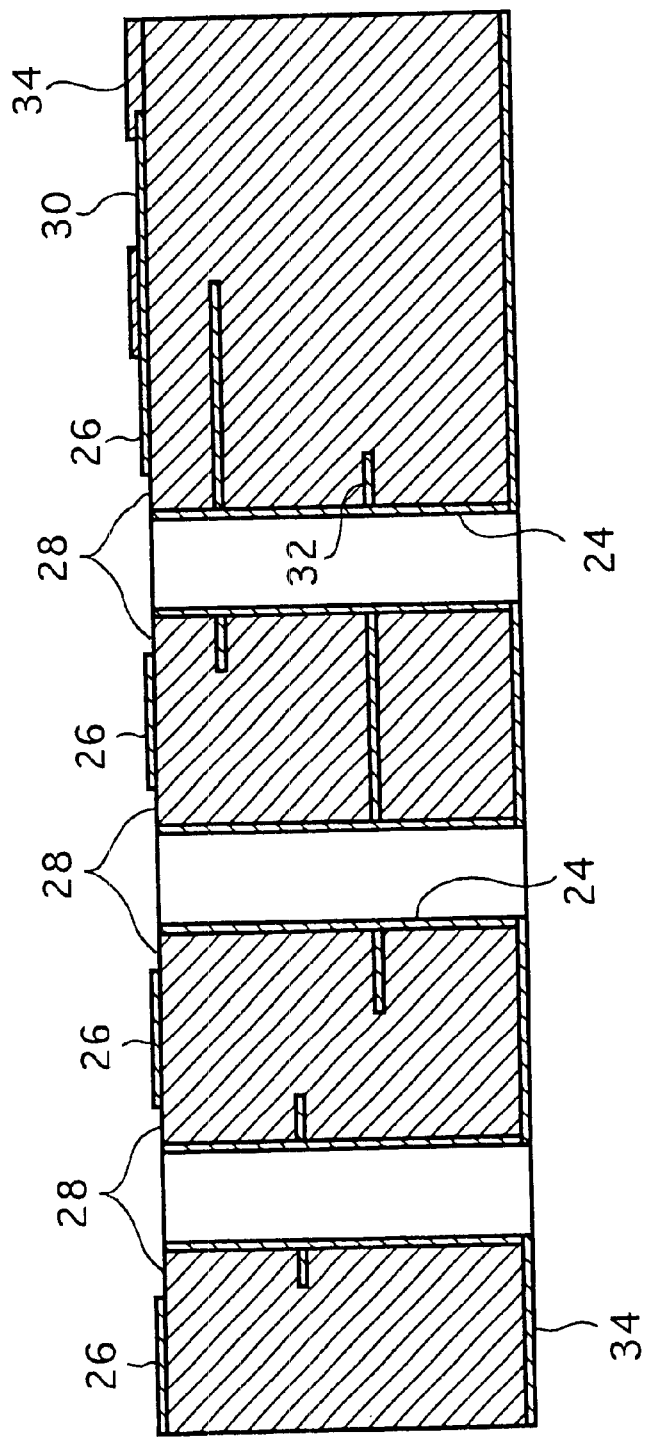
FIG. 5 is a cross section taken along the line 5—5 in FIG. 4.

Referring to FIG. 4, there is shown a partially cutaway plan view of a printed circuit board 20 such as a back wiring board according to a preferred embodiment of the present invention. FIG. 5 is a cross section taken along the line 5—5 in FIG. 4. The printed circuit board 20 is applicable also to a plug-in unit. In the following description, the printed circuit board 20 is assumed to be a back wiring board. The back wiring board 20 includes a substrate 22, a plurality of through holes 24 formed through the substrate 24 in which a plurality of press-fit pins of a press-fit connector are adapted to be respectively press-fitted, and a checking conductor pattern 26 formed on an upper surface 22a of the substrate 22 so as to be electrically insulated from all the through holes 24 and to surround all the through holes 24 for engagement with the press-fit connector.

In general, the press-fit connector has a rectangular connection surface, so that the checking conductor pattern 26 is also rectangular. The checking conductor pattern 26 is formed from a copper pattern, for example. The upper surface 22a of the substrate 22 is exposed at a portion 28 having a predetermined width between each through hole 24 and the checking conductor pattern 26. Alternatively, each portion 28 may be covered with a resist 29 as shown in FIG. 5A. Reference numeral 30 denotes a checking output land electrically connected to the checking conductor pattern 26. As shown in FIG. 5, the inner wall of each through hole 24 is plated copper, and it is in electrical continuity with an inner layer 32 formed from copper foil. The periphery of the checking output land 30 and the back surface of the back wiring board 20 are covered with a resist 34. However, the checking conductor pattern 26 is exposed without being covered with a resist.

Figure 6A:
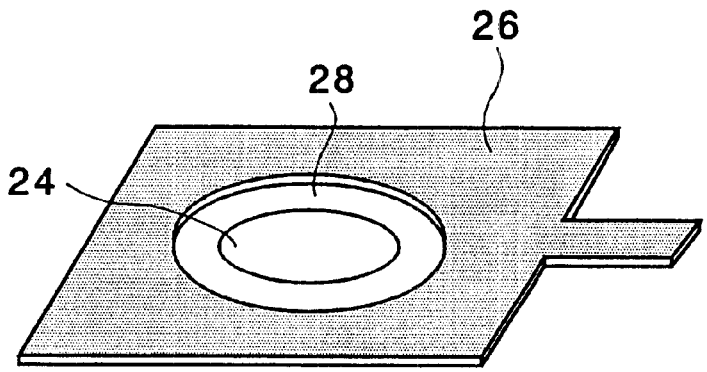
FIG. 6A is a perspective view showing a through hole and a conductor pattern according to the preferred embodiment.
Figure 6B:
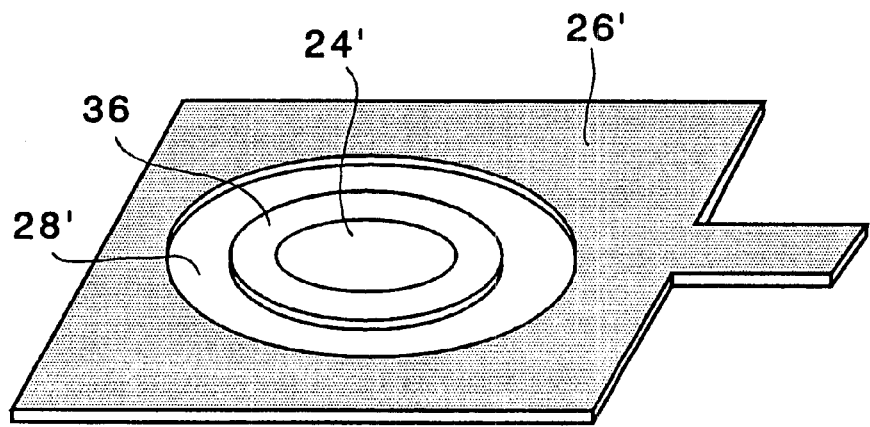
FIG. 6B is a view similar to FIG. 6A, showing another preferred embodiment of the present invention.

FIG. 6A is a schematic perspective view showing one of the through holes 24 and a part of the checking-conductor pattern 26 surrounding the through hole 24. Each through hole 24 is of a type having no land, and it is a drilled hole having a diameter of 0.65 mm. For example, the part of the checking conductor pattern 26 surrounding the through hole 24 has a circular opening having a diameter of 0.95 mm. FIG. 6B is a schematic perspective view showing a through hole 24' of a type having a land 36 and a checking conductor pattern 26' surrounding the through hole 24'. The land 36 of the through hole 24' has an outer diameter of 0.9 mm. Since the through hole 24' has the land 36, the checking conductor pattern 26' surrounding the through hole 24' has a circular opening having a diameter of 1.2 mm, which is larger than the circular opening of the checking conductor pattern 26 shown in FIG. 6A. The present invention is applicable both to a printed circuit board having the through holes of the type shown in FIG. 6A and to a printed circuit board having the through holes of the type shown in FIG. 6B.

Figure 7A:
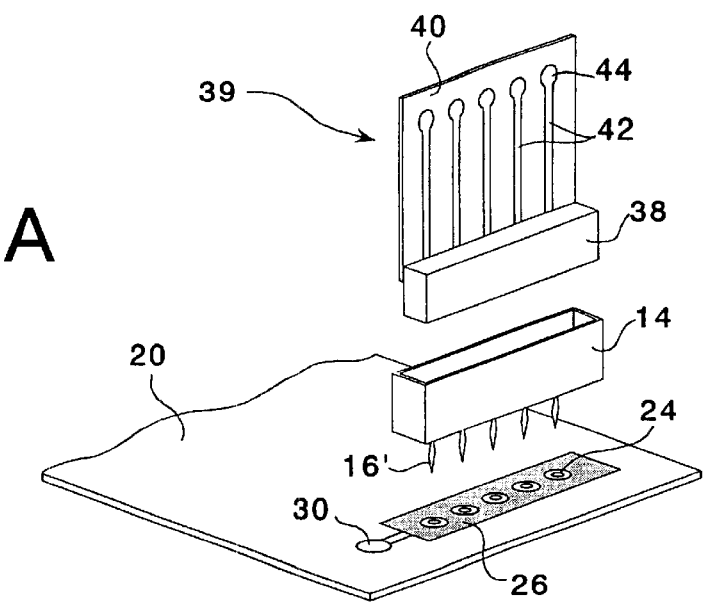
FIGS. 7A to 7C are perspective views showing the steps of a connection checking method for press-fit pins on the BWB side.
Figure 7B:
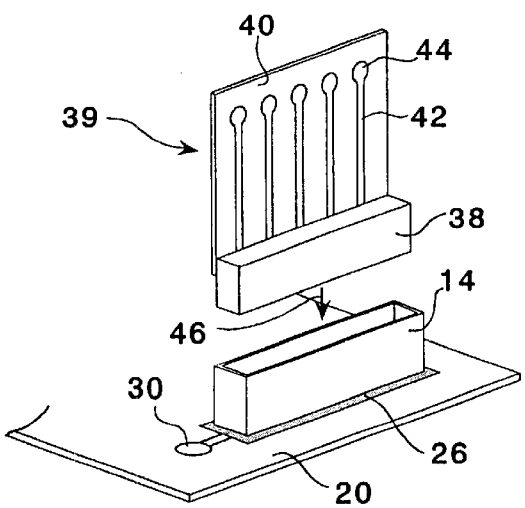
Figure 7C:
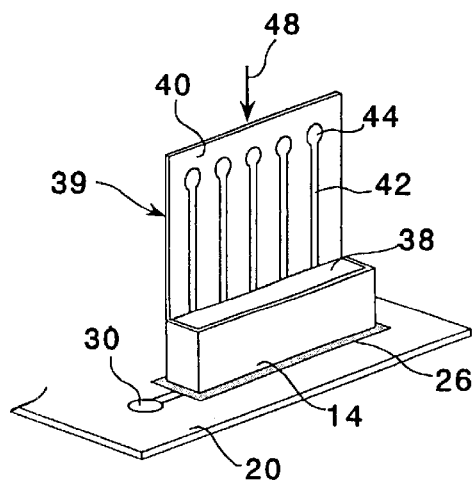

FIGS. 7A to 7C show the steps of a connection checking method for press-fit pins on the BWB side. Referring to FIG. 7A, reference numeral 39 denotes a checking PIU jig composed of a checking printed circuit board 40 and a press-fit connector 38 mounted on the checking printed circuit board 40. The checking printed circuit board 40 has a plurality of conductor patterns 42 respectively connected to a plurality of press-fit pins (not shown) of the press-fit connector 38, and a plurality of output lands 44 respectively formed at the upper ends (front ends) of the conductor patterns 42. Reference numeral 14 denotes a press-fit connector on the BWB side. The press-fit connector 14 has a plurality of press-fit pins 16' each having a relatively small length. It is assumed that the connection between the conductor patterns 42 of the printed circuit board 40 and the press-fit pins of the press-fit connector 38 in the checking PIU jig 39 is preliminarily checked to be complete.

Figure 8:
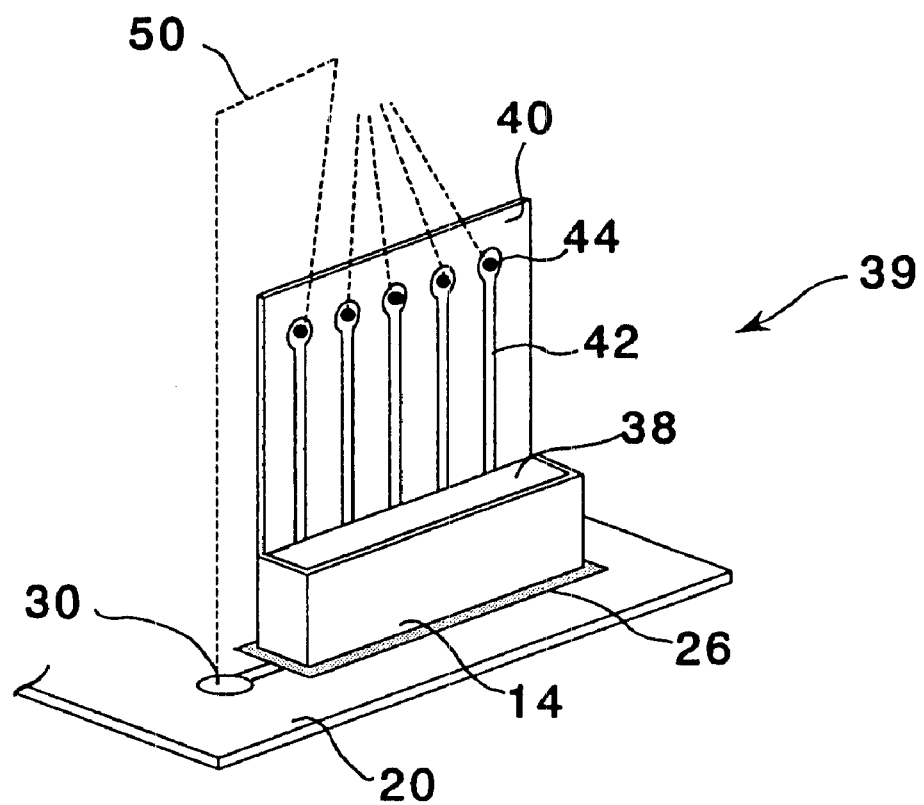
FIG. 8 is a perspective view showing the step of the connection checking method subsequent to the step of FIG. 7C.

As shown in FIG. 7B, the press-fit pins 16' are press-fitted into the through holes 24 of the back wiring board 20 as shown by an arrow 46 to thereby mount the press-fit connector 14 on the back wiring board 20. Thereafter, the press-fit connector 38 of the checking PIU jig 39 is engaged into the press-fit connector 14 on the BWB side as shown by an arrow 48 in FIG. 7c. As a result, the checking PIU jig 39 is electrically connected to the back wiring board 20. Thereafter, the output land 30 of the checking conductor pattern 26 is selectively and sequentially connected to the output lands 40 of the checking PIU jig 39 as shown by a broken line 50 in FIG. 8, thereby checking a connected condition of each press-fit pin 16' of the press-fit connector 14 to the corresponding through hole 24 of the checking conductor pattern 26 of the back wiring board 20.

The selective and sequential connection of the output land 30 of the checking conductor pattern 26 to the output lands 44 of the checking PIU jig 39 may be made by connecting a probe pin to the output land 30 of the checking conductor pattern 26 and sequentially bringing this probe pin into contact with the output lands 44 of the checking PIU jig 39, for example. In this connection check, the detection of no electrical continuity indicates an acceptable mode, and the detection of electrical continuity indicates a defective mode, because any one of the press-fit pins 16' is in contact with the checking conductor pattern 26.

Figure 9:
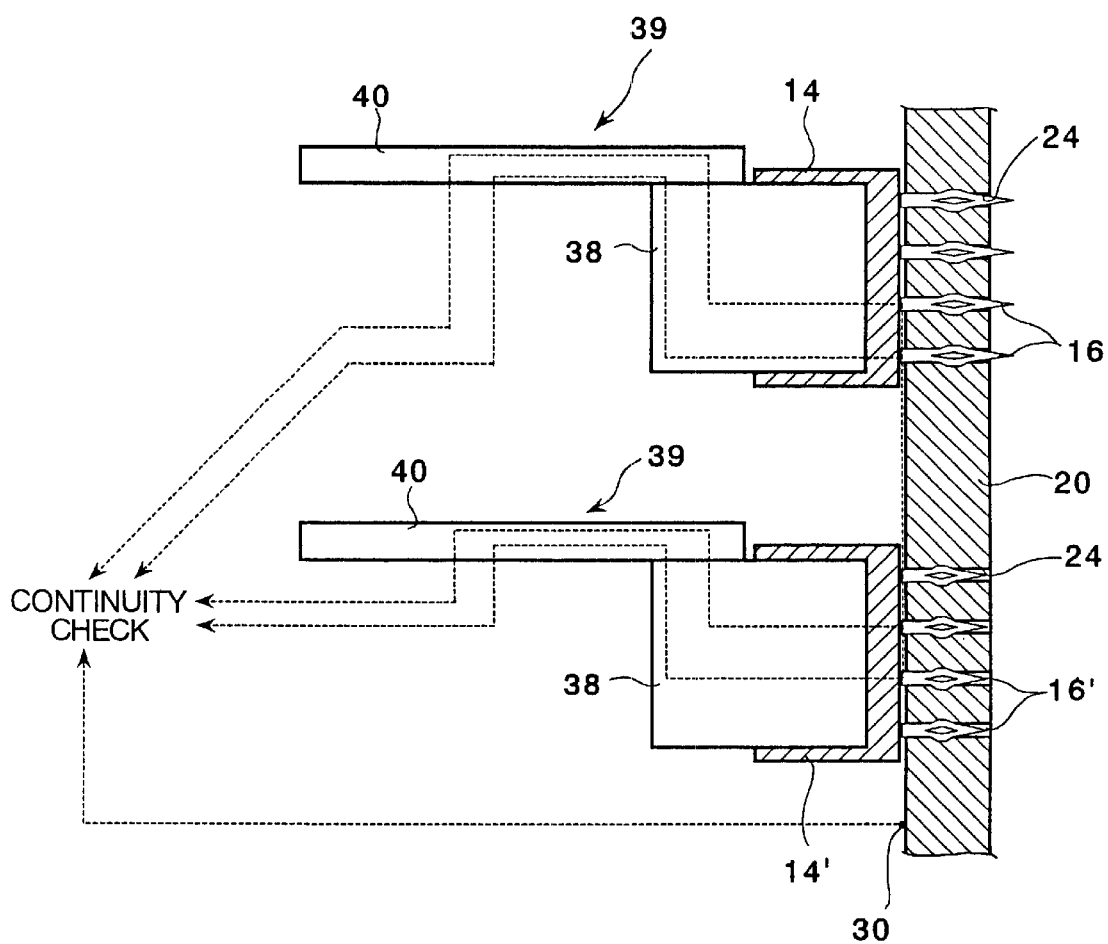
FIG. 9 is a sectional view showing the connection checking method shown in FIG. 8.

FIG. 9 is a sectional view showing a connection checking method for the press-fit pins on the BWB side. In this method, two checking PIU jigs 39 are mounted on the back wiring board 20. One of the two PIU jigs 39 is fitted with a press-fit connector 14 having a plurality of relatively long press-fit pins 16, and the other PIU jig 39 is fitted with a press-fit connector 14' having a plurality of relatively short press-fit pins 16'. The front ends of the relatively long press-fit pins 16 project from the back surface of the back wiring board 20, and the front ends of the relatively short press-fit pins 16' retract from the back surface of the back wiring board 20. Thus, the present invention is applicable to the connection check for both types of press-fit pins. The continuity check may be made by connecting a probe pin to the output land 30 of the checking conductor pattern 26 and sequentially bringing this probe pin into contact with the output lands 44 of the checking PIU jig 39.

Figure 10:
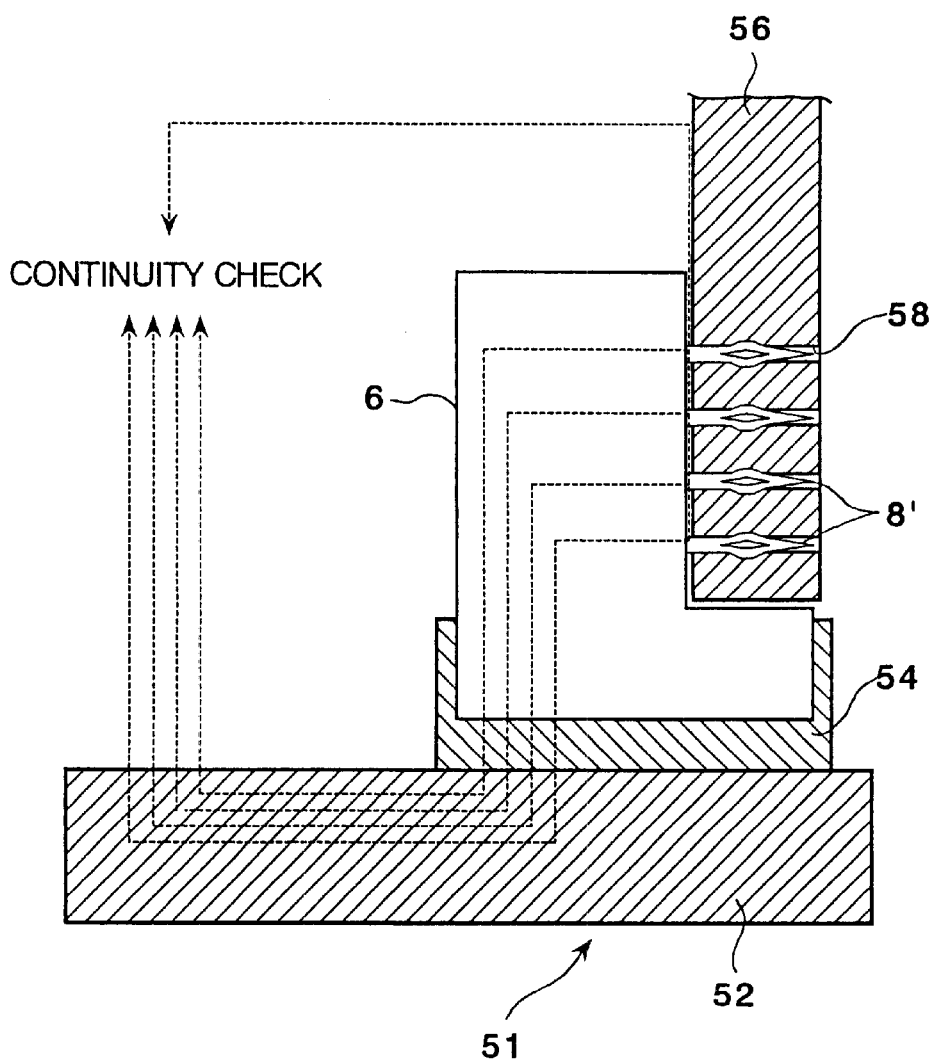
FIG. 10 is a sectional view showing a connection checking method for press-fit pins on the PIU side.

Referring to FIG. 10, there is shown a schematic sectional view showing a connection checking method for the press-fit pins on the PIU side. Reference numeral 51 denotes a checking BWB jig. The checking BWB jig 51 includes a checking printed circuit board 52 and a press-fit connector 54 mounted on the printed circuit board 52 and having a plurality of press-fit pins (not shown). The checking printed circuit board 52 has a plurality of conductor patterns (not shown) respectively connected to the press-fit pins of the press-fit connector 54 and a plurality of output lands (not shown) respectively formed at the front ends of the conductor patterns. It is assumed that the connection of the press-fit connector 54 and the checking printed circuit board 52 is preliminarily checked to be complete.

Reference numeral 56 denotes a plug-in unit. The plug-in unit 56 has a plurality of through holes 58, a checking conductor pattern similar to the conductor pattern 26 shown in FIG. 4, and a checking output land similar to the output land 30 shown in FIG. 4. Reference numeral 6 denotes a press-fit connector having a plurality of press-fit pins 8'. The press-fit pins 8' of the press-fit connector 6 are press-fitted into the through holes 58 of the plug-in unit 56 to thereby mount the press-fit connector 6 on the plug-in unit 56. Thereafter, the press-fit connector 6 is engaged into the press-fit connector 54 of the checking BWB jig 51 to thereby electrically connect the plug-in unit 56 to the checking BWB jig 51.

Figure 11:
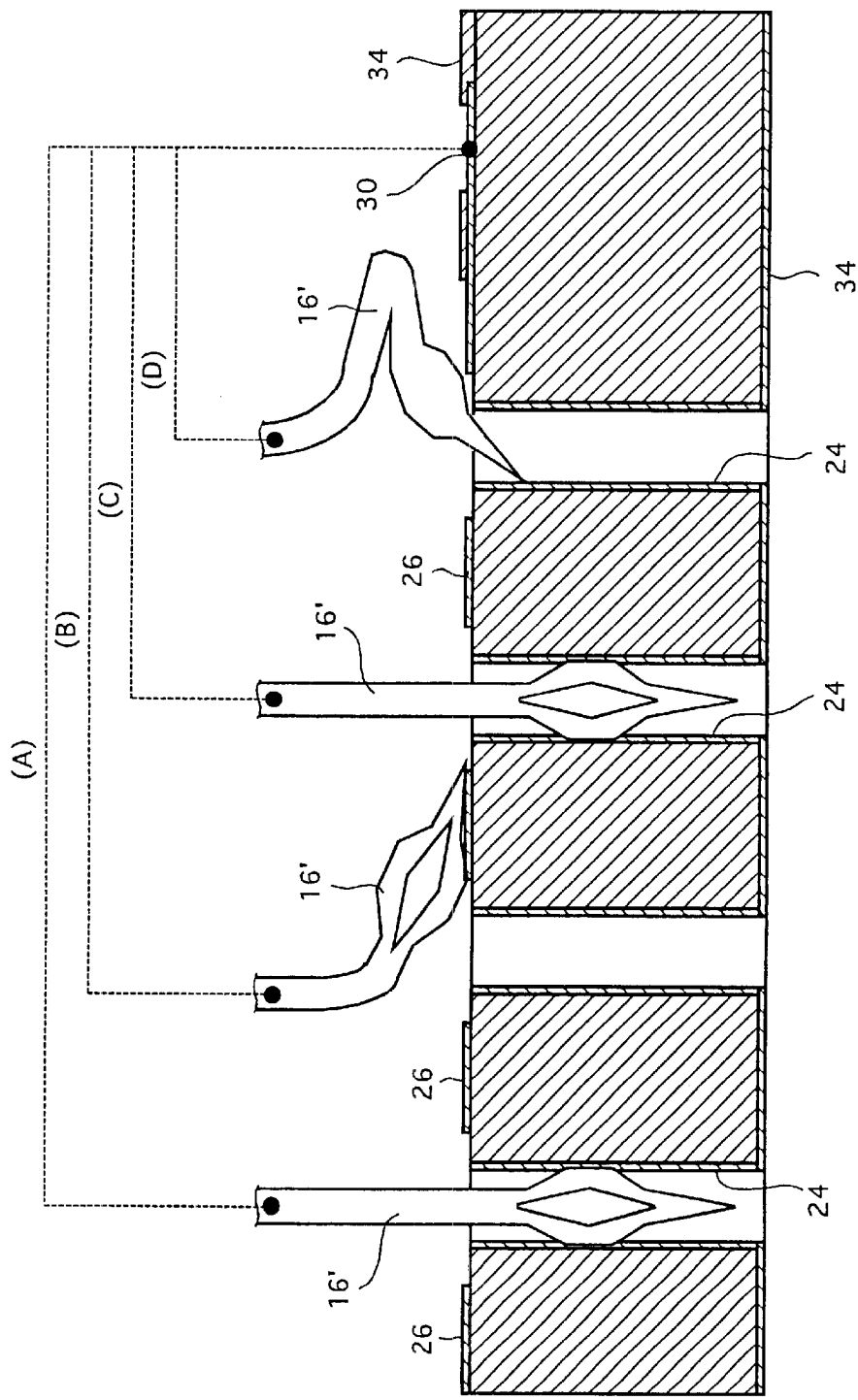
FIG. 11 is a sectional view for illustrating the principle of acceptable/defective determination in the present invention.

The continuity check for the press-fit pins 8' may be made by connecting a probe pin to the checking output land of the plug-in unit 56 and sequentially bringing this probe pin into contact with the output lands of the checking BWB jig 51. In this continuity check, the detection of no electrical continuity indicates an acceptable mode, and the detection of electrical continuity indicates a defective mode. FIG. 11 is a sectional view for illustrating the principle of acceptable/defective determination in the present invention. In FIG. 11, (A) and (C) indicate the case of no electrical continuity=acceptable mode, and (B) and (D) indicate the case of electrical continuity=defective mode.

Figure 12:
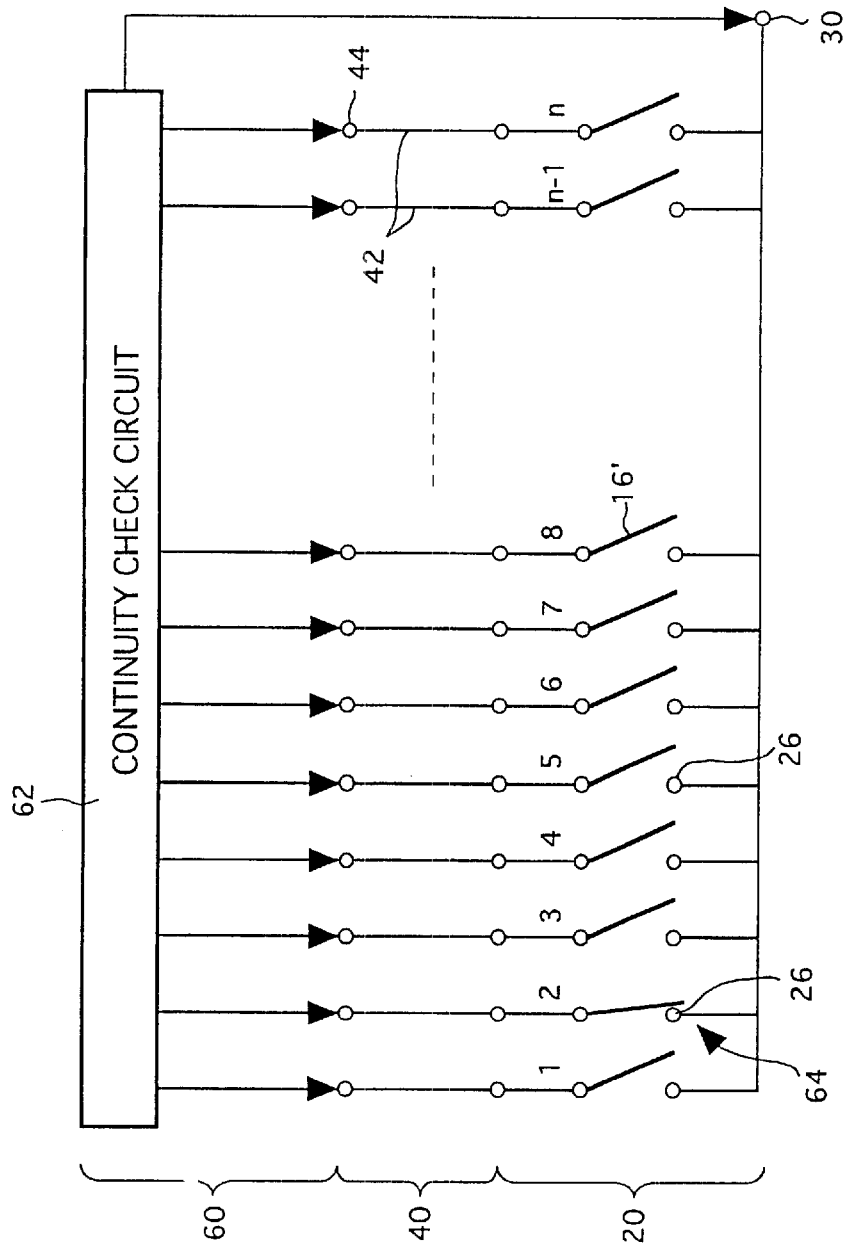
FIG. 12 is a schematic diagram of a check circuit in the present invention.

FIG. 12 is a schematic diagram of a check circuit in the present invention. The back wiring board 20 and the checking printed circuit board 40 are connected by the plural press-fit pins 16'. The checking output land 30 of the back wiring board 20 and the output lands 44 of the checking printed circuit board 40 are selectively and sequentially connected by a checking device 60 having a continuity check circuit 62 to perform the connection check for the press-fit pins 16'. In the case that the connection of any one of the press-fit pins 16' is defective, a switch becomes on as shown by an arrow 64 to detect the electrical continuity.

According to the present invention as described above, even in the case that the length of each press-fit pin is smaller than the thickness of the substrate, defective press-fit of each press-fit pin can be detected by electrical check only. Further, it is sufficient that a checking jig be prepared according to the type of a press-fit connector. Accordingly, the checking jig for electrical check can be simplified and the cost and time for electrical check can be reduced. Further, no visual check is needed and it is therefore possible to prevent the omission of detection of any defective connection.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A printed circuit board suitable for mounting of a press-fit connector having a plurality of press-fit pins, comprising:
    a substrate;
    a plurality of through holes formed through said substrate in which said press-fit pins are adapted to be respectively press-fitted; and
    a checking conductor pattern formed on an upper surface of said substrate so as to be electrically insulated from all of said through holes and to surround all of said through holes for engagement with said press-fit connector, said checking conductor pattern being exposed without being covered with a resist, said checking conductor pattern being a solid pattern enclosing all of said through holes;
    wherein the upper surface of said substrate is exposed at each portion having a predetermined width between each of said through holes and said checking conductor pattern.

2. A printed circuit board according to claim 1, wherein said each portion is covered with a resist.

3. A printed circuit board according to claim 1, further comprising a checking output land electrically connected to said checking conductor pattern.

4. A press-fit pin connection checking system comprising:
    a first press-fit connector having a plurality of first press-fit pins;

a first printed circuit board having a first substrate, a plurality of first through holes formed through said first substrate in which said first press-fit pins are adapted to be respectively press-fitted, and a first conductor pattern formed on an upper surface of said first substrate so as to be electrically insulated from all of said first through holes and to surround all of said first through holes for engagement with said first press-fit connector, said first conductor pattern being exposed without being covered with a resist, said first conductor pattern being a solid pattern enclosing all of said first through holes;

a second press-fit connector having a plurality of second press-fit pins and adapted to engage with said first press-fit connector;

a second printed circuit board having a second substrate, a plurality of second through holes formed through said second substrate in which said second press-fit pins are adapted to be respectively press-fitted, a plurality of second conductor patterns formed on said second substrate so as to be respectively connected to said second through holes, and a plurality of output lands respectively connected to said second conductor patterns; and means for selectively connecting said first conductor pattern to said output lands.

5. A press-fit pin connection checking system according to claim 4, wherein the upper surface of said first substrate is exposed at each portion having a predetermined width between each of said first through holes and said first conductor pattern.

6. A press-fit pin connection checking system according to claim 5, wherein said each portion is covered with a resist.

7. A press-fit pin connection checking system according to claim 4, wherein said first printed circuit board further has a checking output land electrically connected to said first conductor pattern.

8. A press-fit pin connection checking method comprising the steps of:

providing a first printed circuit board having a plurality of first through holes in which a plurality of first press-fit pins of a first press-fit connector are adapted to be respectively press-fitted, and a first conductor pattern formed so as to be electrically insulated from all of said first through holes and to surround all of said first through holes for engagement with said first press-fit connector, said first conductor pattern being exposed without being covered with a resist, said first conductor pattern being a solid pattern enclosing all of said first through holes;

press-fitting said plurality of first press-fit pins of said first press-fit connector into said plurality of first through holes of said first printed circuit board to thereby mount said first press-fit connector on said first printed circuit board;

providing a checking jig including a second printed circuit board and a second press-fit connector mounted on said second printed circuit board, said second printed circuit board having a plurality of second through holes, a plurality of second conductor patterns respectively connected to said second through holes, and a plurality of output lands respectively connected to said second conductor patterns, said second press-fit connector having a plurality of second press-fit pins press-fitted in said plurality of second through holes of said second printed circuit board;

engaging said second press-fit connector of said checking jig with said first press-fit connector mounted on said first printed circuit board; and selectively connecting said first conductor pattern of said first printed circuit board to said respective output lands of said second printed circuit board;

wherein when there is no electrical continuity between said first conductor pattern and each of said output lands, it is determined that the connection of said first press-fit pins and said first through holes is acceptable, whereas when there is electrical continuity between said first conductor pattern and each of said output lands, it is determined that the connection of said first press-fit pins and said first through holes is defective.

9. A press-fit pin connection checking method according to claim 8, wherein:

said first printed circuit board further has a checking output land electrically connected to said first conductor pattern; and the selective connection of said first conductor pattern and said output lands is provided by connecting a checking device having a continuity check circuit to said checking output land and selectively bringing said checking device into contact with said output lands.

10. A press-fit pin connection checking method according to claim 8, wherein a substrate of said first printed circuit board is exposed at a portion having a predetermined width between each of said first through holes and said first conductor pattern.

* * * * *